United States Patent [19]
Kajihara

[11] Patent Number: 5,656,833
[45] Date of Patent: Aug. 12, 1997

[54] GATE ARRAY TYPE SEMICONDUCTOR DEVICE WITH FLEXIBLE PELLET SIZE

[75] Inventor: Mamoru Kajihara, Tokyo, Japan

[73] Assignee: NEC Corporation, Tokyo, Japan

[21] Appl. No.: 544,854

[22] Filed: Oct. 18, 1995

Related U.S. Application Data

[63] Continuation of Ser. No. 318,109, Oct. 5, 1994, abandoned

[30] Foreign Application Priority Data

Oct. 6, 1993 [JP] Japan .................. 5-249649

[51] Int. Cl.⁶ ............................................. H01L 27/10
[52] U.S. Cl. ....................... 257/203; 257/202; 257/211
[58] Field of Search ............................ 257/203, 202, 257/211

[56] References Cited

U.S. PATENT DOCUMENTS 4,864,381  9/1989  Seefeldt et al. ................ 257/203
5,229,629  7/1993  Koike .............................. 257/202

FOREIGN PATENT DOCUMENTS 3-83376  4/1991  Japan .............................. 257/203

*Primary Examiner*—Steven H. Loke
*Attorney, Agent, or Firm*—Sughrue, Mion, Zinn, Macpeak & Seas

[57] ABSTRACT

A gate array type semiconductor device has a plurality of basic array block cells. The basic array block cells are made up of at least one basic cell and only one input/output cell. Additionally, the basic array block cells are arranged in a matrix form on a mother wafer. The number of the basic cells in each basic array block cell is determined by a gate scale requirement but the number of input/output cells remain one. Different pellet sizes may be provided on the same mother wafer. This enables to produce various kinds of gate arrays in a short turn around time and a low cost.

21 Claims, 4 Drawing Sheets

GATE ARRAY TYPE SEMICONDUCTOR DEVICE WITH FLEXIBLE PELLET SIZE

This is a Continuation of Application No. 08/318,109 filed Oct. 5, 1994, now abandoned.

BACKGROUND OF THE INVENTION (1) Field of the Invention

The present invention relates to a semiconductor device, and more particularly to a gate array type semiconductor device wherein a gate array is formed on a semiconductor wafer.

(2) Description of the Related Art

A conventional gate array having an arrangement wherein a plurality of gate elements are arranged in a matrix form on an entire surface of a wafer is disclosed in, for example, Japanese Patent Application Kokai Publication No. Hei 3(1991)-83376. This conventional gate array is characterized in that a pellet size and/or a bonding pad area therefor can be set more freely than a master substrate of a commonly available gate array.

FIGS. 1A and 1B show an arrangement of the above conventional gate array. FIG. 1A illustrates an arrangement wherein a plurality of basic cell areas 10 each consisting of a plurality of basic cells and wiring areas 11 are arranged alternately on a mother wafer 3. On the mother wafer 3 having the plurality of basic cell areas 10 and wiring areas 11, there is provided a circuit area covering both a gate scale for a desired logic circuit and a gate scale for some redundant circuits. The logic circuit required is realized by the necessary number of basic cells involved in the circuit area, and an input and output (I/O) circuit is also realized by a combination of the basic cells therein. FIG. 1B shows a pellet 12 in which a plurality of input/output circuit cells 2 and bonding pads 5 are arranged.

The above conventional gate array structure is characterized in that a pellet size is not fixed and the necessary logic circuit can be realized in a minimum pellet size.

The conventional gate array arrangement wherein the basic cell areas and the wiring areas are alternately arranged on the entire surface of the mother wafer, however, has the following drawbacks. That is, this arrangement is weak in tolerance against electrostatic break down voltage and renders output current vs. voltage characteristics inferior than those of a commonly available gate array. This is because the I/O circuit is constituted by the selective combination of the basic cells in this arrangement. Moreover, with the adjustable pellet size, the pellet size is changed each time a new gate array is designed, though the pellet size itself may be made smaller. The variable pellet size needs to produce various kinds of wafer probing tools and assembling tools and to check adaptability of the gate array to a lead frame each time a new gate array is designed. This is disadvantageous in light of TAT (Turn Around Time) or cost.

SUMMARY OF THE INVENTION

It is an object of the present invention to provide a gate array type semiconductor device which utilizes a mother wafer having basic cells and I/O cells in a matrix form covering the overall wafer so that just one mother wafer is required for forming various kinds of master substrates.

It is a further object of the present invention to provide a gate array type semiconductor device which has various kinds of pellets mixed on one mother wafer so that a small number but various kinds of gate arrays may be produced in a short manufacturing TAT and a low cost.

According to one aspect of the invention, there is provided a gate array type semiconductor device comprising:

a plurality of basic cells which are interconnected by predetermined wiring interconnections for performing desired logic operations;

a plurality of input/output cells which operate for inputting external signals to the basic cells and outputting output signals from the basic cells; and a plurality of basic array block cells which are arranged in a matrix form on one surface of a mother wafer, each of the basic array block cells being constituted in a ratio such that there is one of the input/output circuit cells in n (n being an integer) number of the basic cells.

In one gate array type semiconductor device according to the invention, the basic array block cells are grouped as a first gate array and a second gate array, and the first gate array constituted by x (x being an integer) number of the basic array block cells and the second gate array constituted by y (y being an integer different from x) number of the basic array block cells are disposed in a mixed form on the same mother wafer.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Herein, descriptions will be made with respect to a gate array type semiconductor device according to a first embodiment of the present invention.

Figure 1A:
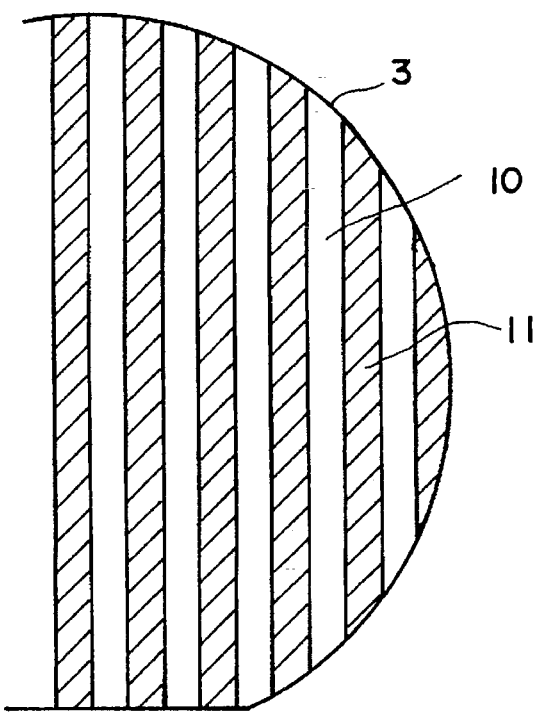
FIGS. 1A and 1B are diagrammatic views showing a gate array type semiconductor device according to the prior art, FIG. 1A illustrating an arrangement of basic cell areas and wiring areas on a mother wafer and FIG. 1B illustrating an arrangement of bonding pads and I/O circuit cells in a pellet.
Figure 1B:
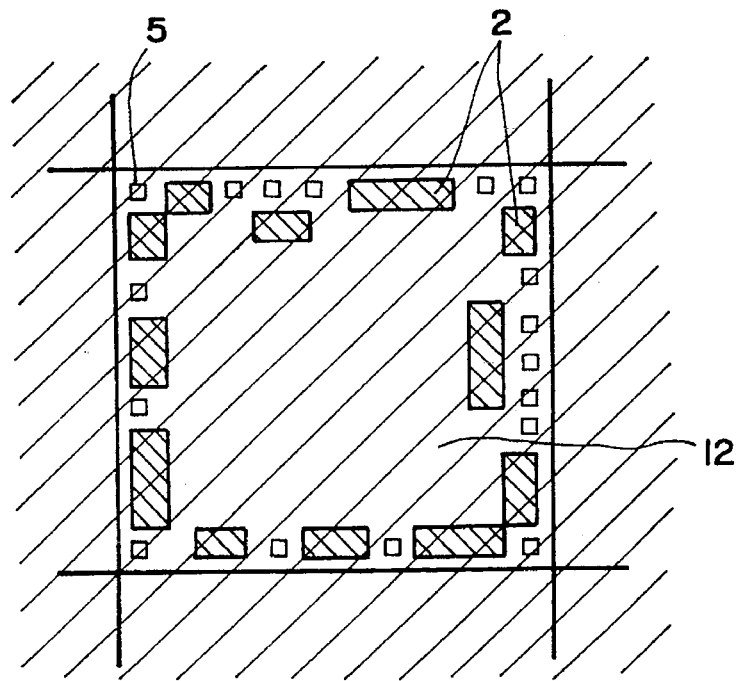
Figure 2A:
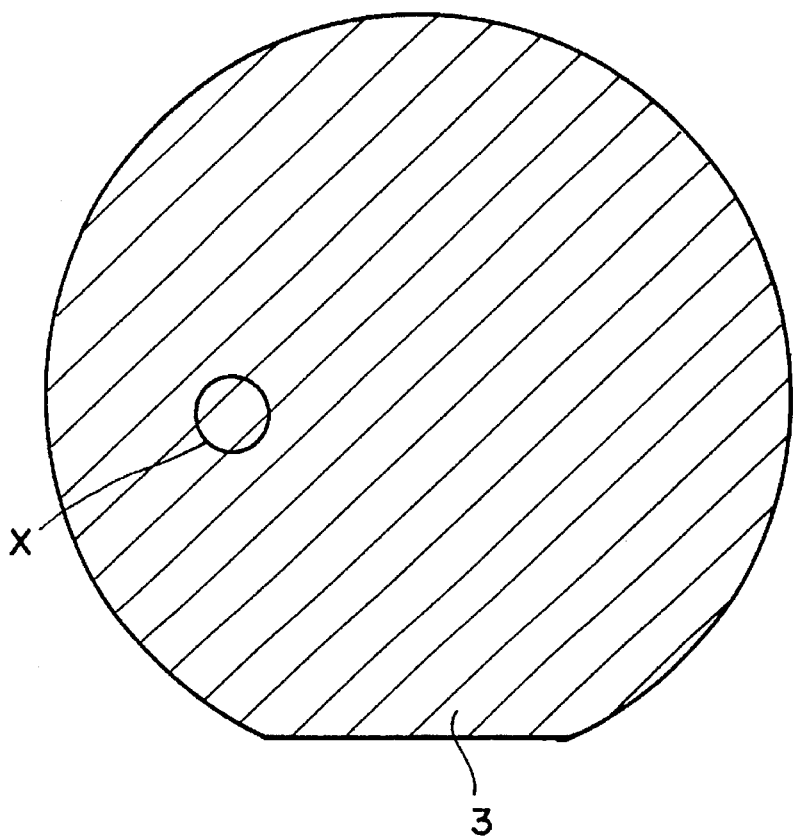
FIGS. 2A and 2B are diagrammatic views showing an arrangement of a gate array type semiconductor device according to a first embodiment of the present invention, FIG. 2A illustrating a mother wafer and FIG. 2B illustrating a partial enlarged view of FIG. 2A.
Figure 2B:
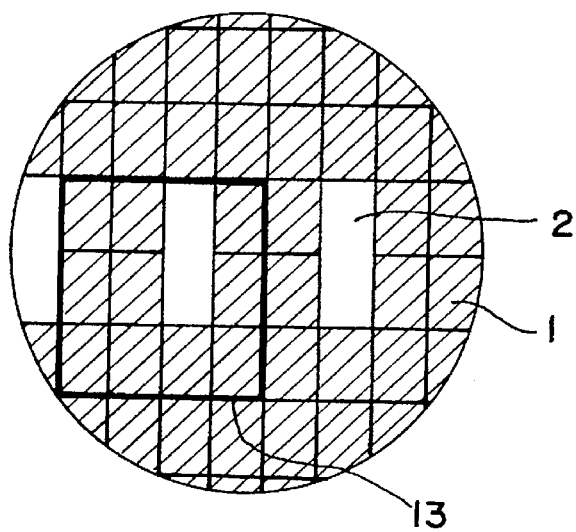

With reference to FIG. 2B which is a partial enlarged view at a portion X of a mother wafer 3 shown in FIG. 2A, a numeral 13 denotes a basic array block cell which is composed of ten basic cells 1 and one I/O circuit cell 2. The basic array block cells 13 in a matrix form are located on the overall surface of the mother wafer 3.

Figure 3:
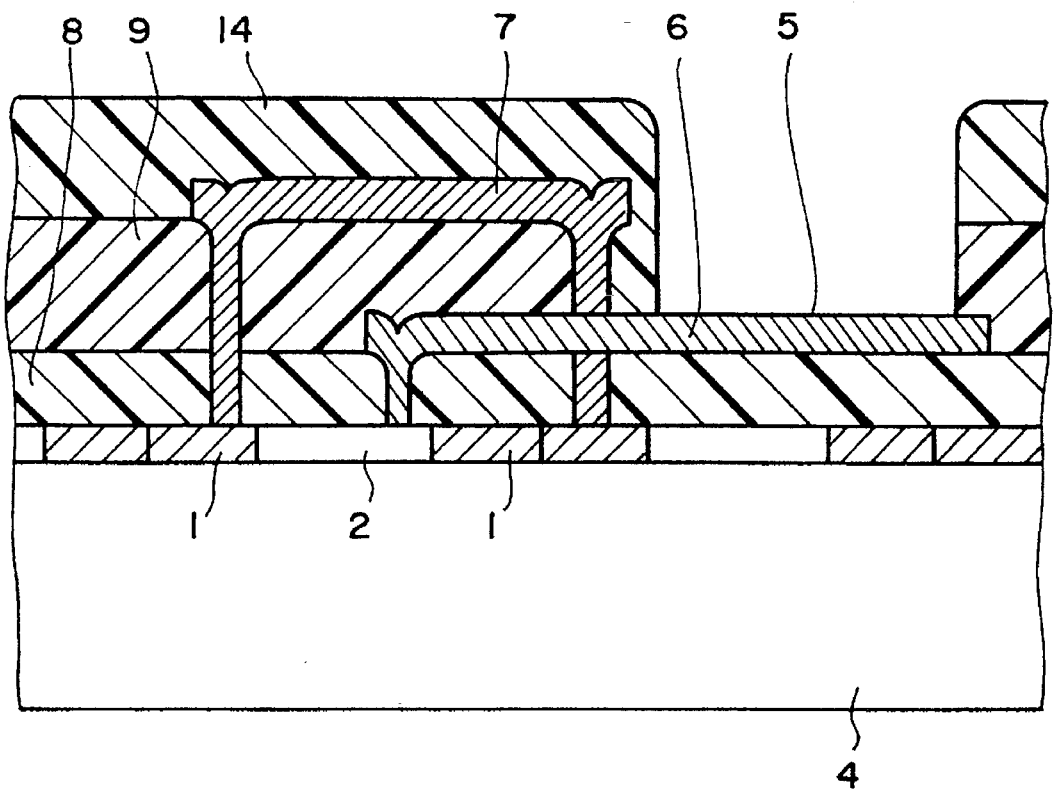
FIG. 3 is a sectional view showing a wiring structure of the gate array type semiconductor device shown in FIGS. 2A and 2B.

The wiring process, as shown in FIG. 3, is carried out by the multilayer technique known in this technical field. As shown therein, the wiring layers are formed on the top surface of the basic cells 1 and the I/O cell 2 which are formed in the surface region of a wafer 4. A bonding pad is also formed on the same. Specifically, a first wiring layer 6 connected to the I/O cell 2 is formed on the wafer 4 with a first insulation film 8 intervened therebetween. A second insulation film 9 is formed on the first insulation film 8 and the first wiring layer 6. A second wiring layer 7 connected to the basic cell 1 is formed on the second insulation film 9. A passivation film 14 is formed on the second insulation film 9 and the second wiring layer 7. A portion of the passivation and insulation films is removed to expose an upper surface of the wiring layer. In FIG. 3, a portion of the first wiring layer 6 is exposed so that a bonding pad 5 is formed thereat.

The pellet size to be set on this semiconductor device is determined based on the required gate scale and also the required number of I/O signal pins. In actuality, however, the pellet size is not required to be adjusted to such a minimum size as meeting the necessary gate scale and the number of pins. Ten pellet sizes/types are prepared. For each pellet size, the number and the location of the bonding pads are fixed.

As such, in the gate array type semiconductor device of this embodiment, it is necessary to prepare only the number of wafer probing tools and lead frames corresponding to ten pellet sizes/types, which makes it possible to reduce the relevant TAT and the cost. The I/O circuit cell 2 included in the basic gate array block 13 serves to protect the input from an electrostatic break down voltage while the output current level and the output voltage level are the same as those of the commonly available gate array.

As can be understood from the above, the user of this device can design a substrate without having to consider the arrangement wherein the basic cells 1 and the I/O cells 2 are arranged in a matrix form on the wafer. The device also allows the manufacturer to use the conventional manufacturing, probing and handling processes without any change.

Figure 4:
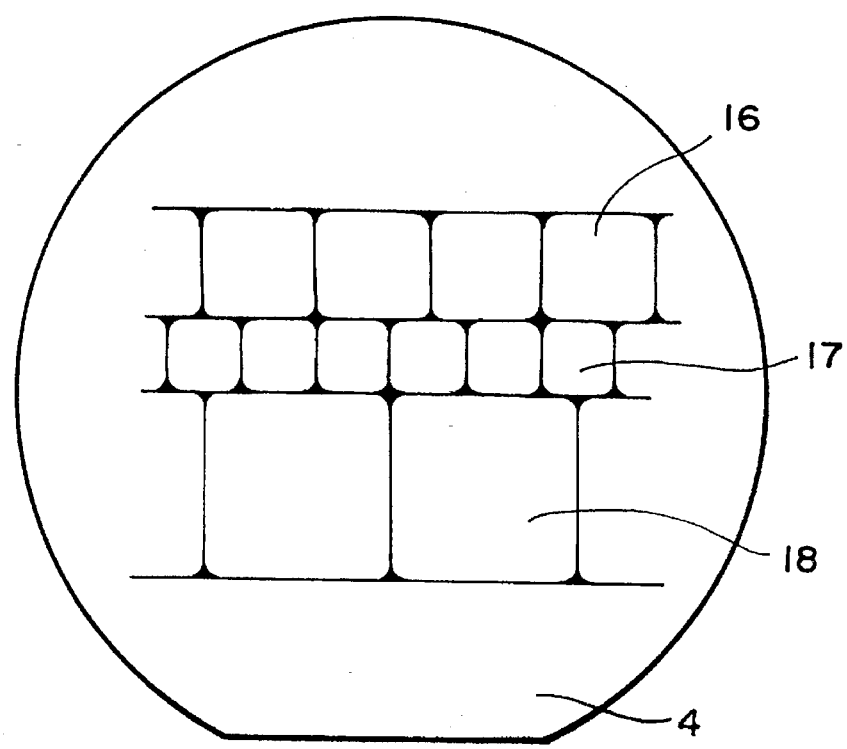
FIG. 4 is a diagrammatic view showing an arrangement of pellets on a wafer of the gate array type semiconductor device shown in FIGS. 2A and 2B.

Turning to FIG. 4, it will be understood from this figure that the semiconductor device of this embodiment may have various kinds of pellets 16, 17 and 18, whose pellet sizes and functions are different from one another, on one wafer.

The commonly available or conventional gate array has a defined master at the time of starting a diffusing step of a manufacturing process for a gate array. Hence, pellets of the same master only are allowed to be formed on one wafer. On the other hand, the gate array type semiconductor device of this embodiment enables to locate any kind of pellet with any size at any location on the wafer. The semiconductor device, therefore, allows various kinds of pellets to be arranged on one wafer, irrespective of the size and the gate scale of a master substrate, that is, a pellet.

In other words, this semiconductor device enables to define any kind of master substrate required, only if one mother wafer is prepared. This makes it possible to lessen the burden of managing the mother wafer and production management.

Now, a description will be made for a gate array type semiconductor device according to a second embodiment of the present invention with reference to FIGS. 5A and 5B.

Figure 5A:
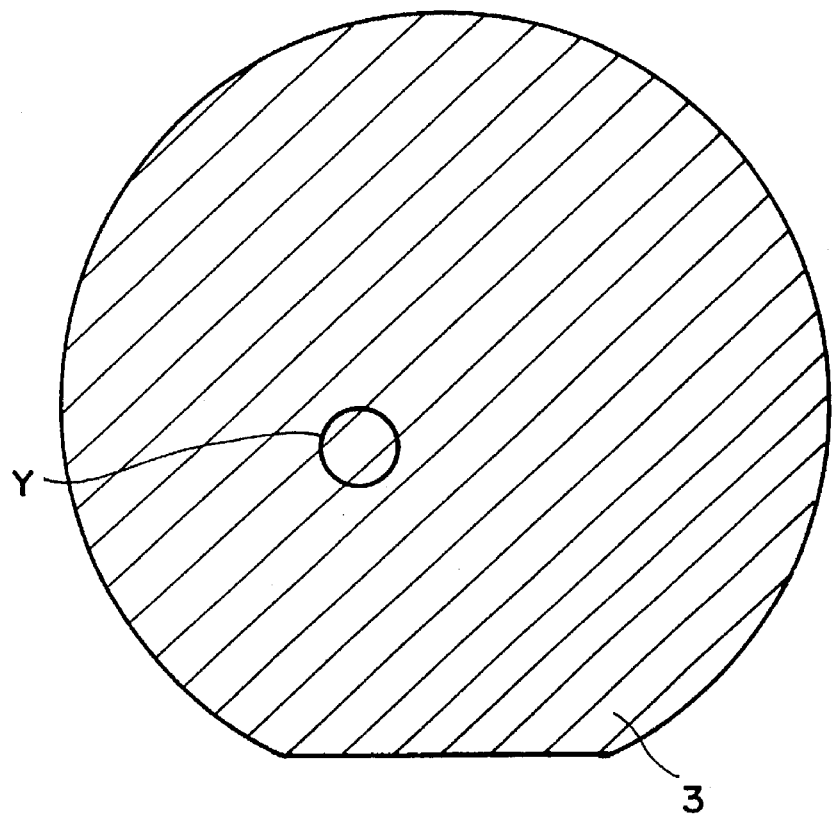
FIGS. 5A and 5B are diagrammatic views showing an arrangement of a gate array type semiconductor device according to a second embodiment of the present invention, FIG. 5A illustrating a mother wafer and FIG. 5B illustrating a partial enlarged view of FIG. 5A.
Figure 5B:
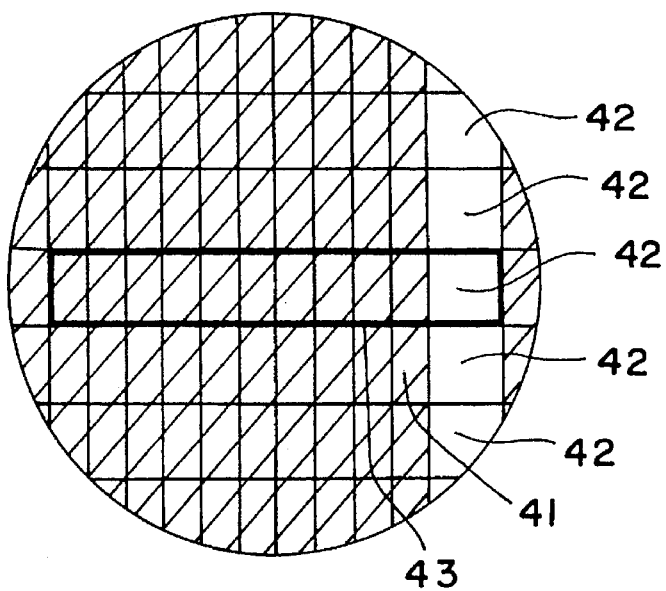

As shown in FIG. 5B which is a partial enlarged view of a portion Y of the mother wafer 3 shown in FIG. 5A, the gate array type semiconductor device of the second embodiment has a plurality of basic array block cells 43 of a stripe type each consisting of a plurality of basic cells 41 and one I/O cell 42. As such, the semiconductor device includes all the I/O cells 42 collectively located in a stripe form. This arrangement results in simplifying the wiring connection between the I/O cell 42 and a bonding pad (not shown) and facilitating the automatic locating and wiring process carried out by the CAD system, thereby shortening the CAD processing time.

According to the first and the second embodiment, the ratio of the basic cell 1 or 41 to the I/O cell 2 or 42 is set to 10 to 1. This ratio is derived from the gate scale of the commonly used gate array and the maximum number of I/O signal terminals at the gate scale. As the gate scale is made larger, this ratio changes such as 100 to 1 or 500 to 1. Assuming that the gate array to which the invention is applied provides a gate scale of 10K gates or more, the ratio of 100 to 1 suffices the required number of the I/O cells. The semiconductor device of the invention may, therefore, make the pellet size smaller by the reduced number of I/O cells.

Many widely different embodiments of the present invention may be constructed without departing from the spirit and scope of the present invention. It should be understood that the present invention is not limited to the specific embodiments described in the specification, except as defined in the appended claims.

What is claimed is:

1. A gate array type semiconductor device, comprising:
a first gate array which is only formed by a first plurality of basic array block cells,
wherein each of said basic array block cells comprises at least one basic cell and only one input/output cell,
wherein said basic cells of said first gate array are interconnected by predetermined wiring interconnections for performing desired logic operations, and
wherein said input/output cells of said first gate array input signals to said basic cells and output signals from said basic cells.

2. The gate array type semiconductor device according to claim 1, further comprising:
a second gate array which only contains a second plurality of basic array block cells, wherein a number of said basic array block cells contained in said second gate array is greater than a number of said basic array block cells contained in said first gate array.

3. The gate array type semiconductor device according to claim 1, wherein said one input/output cell and said at least one basic cell in each of said basic array block cells are arranged in a stripe.

4. The gate array type semiconductor device according to claim 1, wherein each of said basic array block cells contains a predetermined number of said basic cells and wherein said predetermined number is determined by at least a gate scale requirement of said first gate array.

5. The gate array type semiconductor device according to claim 1, wherein each of said basic array block cells contains an identical number of said basic cells.

6. The gate array type semiconductor device according to claim 5, wherein each of said basic array block cells has an identical shape.

7. The gate array type semiconductor device according to claim 6, wherein said one input/output cell of each of said basic array block cells is located in an identical position within each of said basic array block cells.

8. The gate array type semiconductor device according to claim 1, wherein each of said basic array block cells has an identical shape.

9. A gate array type semiconductor device, comprising:
a first gate array which is only formed by a plurality of first basic array block cells,
wherein each of said first basic array block cells contains a first predetermined number of basic cells and only one input/output cell, wherein said basic cells of said first gate array are interconnected by predetermined wiring interconnections for performing desired logic operations, and wherein said input/output cells of said first gate array input signals to said basic cells and output signals from said basic cells.

10. The gate array type semiconductor device according to claim 9, wherein each of said first basic array block cells has an identical shape.

11. The gate array type semiconductor device according to claim 10, wherein said one input/output cell of each of said first basic array block cells is located in an identical position within each of said first basic array block cells.

12. The gate array type semiconductor device according to claim 9, wherein said first predetermined number is determined by at least a gate scale requirement of said first gate array.

13. The gate array type semiconductor device according to claim 9, further comprising:

a second gate array which only contains a plurality of second basic array block cells, wherein each of said second basic array block cells contains a second predetermined number of basic cells and only one input/output cell.

14. The gate array type semiconductor device according to claim 13, wherein a number of said second basic array block cells contained in said second gate array is greater than a number of said first basic array block cells contained in said first gate array.

15. The gate array type semiconductor device according to claim 13, wherein said second predetermined number is equal to said first predetermined number.

16. A method of forming a gate array type semiconductor device, comprising the steps of:

forming a plurality of first basic array block cells each having a first predetermined number of basic cells and only one input/output cell; and forming a first gate array by arranging said plurality of first basic array block cells in a contiguous manner such that said first gate array contains only said plurality of first basic array block cells, wherein said basic cells of said first gate array are interconnected by predetermined wiring interconnections for performing desired logic operations, and wherein said input/output cells of said first gate array input signals to said basic cells and output signals from said basic cells.

17. The method of forming a gate array type semiconductor device according to claim 16, further comprising the steps of:

forming a plurality of second basic array block cells each having a second predetermined number of said basic cells and only one input/output cell; and forming a second gate array by arranging said plurality of second basic array block cells in a contiguous manner such that said second gate array contains only said plurality of second basic array block cells.

18. The method of forming a gate array type semiconductor device according to claim 17, wherein said second predetermined number is equal to said first predetermined number.

19. The method of forming a gate array type semiconductor device according to claim 17, wherein a number of second basic array block cells contained in said second gate array is greater than a number of first basic array block cells contained in said first gate array.

20. The method of forming a gate array type semiconductor device according to claim 16, wherein each of said first basic array block cells has an identical shape.

21. The method of forming a gate array type semiconductor device according to claim 20, wherein said one input/output cell of each of said first basic array block cells is located in an identical position within each of said first basic array block cells.

* * * * *